United States Patent
Hong et al.

(10) Patent No.: US 10,635,244 B2
(45) Date of Patent: Apr. 28, 2020

(54) HEAD MOUNTED DISPLAY DEVICE AND FABRICATING METHOD THEREOF

(71) Applicant: SAMSUNG DISPLAY CO., LTD., Yongin-si, Gyeonggi-do (KR)

(72) Inventors: Won Ki Hong, Yongin-si (KR); Jong Seo Lee, Yongin-si (KR)

(73) Assignee: Samsung Display Co., Ltd. (KR)

( * ) Notice: Subject to any disclaimer, the term of this patent is extended or adjusted under 35 U.S.C. 154(b) by 237 days.

(21) Appl. No.: 15/169,480

(22) Filed: May 31, 2016

(65) Prior Publication Data

US 2017/0097701 A1    Apr. 6, 2017

(30) Foreign Application Priority Data

Oct. 2, 2015    (KR) .................. 10-2015-0139067

(51) Int. Cl.
G02B 27/01 (2006.01)
G06F 3/044 (2006.01)
G06F 3/041 (2006.01)
H01L 27/12 (2006.01)

(52) U.S. Cl.
CPC .......... *G06F 3/044* (2013.01); *G02B 27/017* (2013.01); *G02B 27/0172* (2013.01); *G06F 3/0412* (2013.01); *G06F 3/0414* (2013.01); *H01L 27/124* (2013.01); *H01L 27/1218* (2013.01); *H01L 27/1262* (2013.01); *G02B 2027/0132* (2013.01); *G02B 2027/0178* (2013.01); *G06F 2203/04103* (2013.01)

(58) Field of Classification Search
CPC ... G02B 27/017; G02F 1/13338; G06F 3/044; G06F 3/0412; G06F 1/163; G06F 3/011
USPC ............... 345/8, 173, 174; 351/158
See application file for complete search history.

(56) References Cited

U.S. PATENT DOCUMENTS

| | | | |
|---|---|---|---|
| 8,836,768 B1 | 9/2014 | Rafii et al. | |
| 8,917,453 B2 | 12/2014 | Bohn | |
| 8,957,835 B2 | 2/2015 | Hoellwarth | |
| 2010/0110368 A1* | 5/2010 | Chaum ................ | G02B 27/017 351/158 |
| 2011/0157039 A1* | 6/2011 | Shin .................... | G02F 1/13338 345/173 |
| 2012/0268396 A1* | 10/2012 | Kim ..................... | G06F 3/0412 345/173 |
| 2013/0181888 A1* | 7/2013 | Kuriya ................ | G02B 27/017 345/8 |
| 2014/0022186 A1 | 1/2014 | Hong et al. | |
| 2014/0160424 A1* | 6/2014 | Benko ................. | G06F 1/163 351/158 |
| 2014/0340348 A1* | 11/2014 | Park .................... | G06F 3/044 345/174 |
| 2014/0354514 A1 | 12/2014 | Aronsson | |
| 2016/0216792 A1* | 7/2016 | Ogawa ................ | G06F 3/011 |

* cited by examiner

*Primary Examiner* — Abdul-Samad A Adediran
(74) *Attorney, Agent, or Firm* — Innovation Counsel LLP

(57) ABSTRACT

A head mounted display device includes: display part disposed to correspond to two eyes of a user, and including wires and one or more pixels connected to the wires; and a sensor disposed around the display part and configured to sense a touch of the user. The sensor includes sensing electrodes, and at least one of the sensing electrodes is provided on the same layer as a portion of the display part.

18 Claims, 10 Drawing Sheets

HEAD MOUNTED DISPLAY DEVICE AND FABRICATING METHOD THEREOF

CROSS-REFERENCE TO RELATED APPLICATION

This application claims priority to and the benefit of Korean Patent Application No. 10-2015-0139067, filed on Oct. 2, 2015, in the Korean Intellectual Property Office, the disclosure of which is incorporated herein by reference in its entirety.

BACKGROUND

1. Field

The present disclosure relates to a head mounted display device that is wearable on a head of a user, and a fabricating method thereof.

2. Description of the Related Art

As the electronics technology advances, various electronic devices for improving convenience of a user have been developed. Particularly, display devices for displaying an image have been developed in various forms. For example, a head mounted display is mounted on a head of a user to display an image in front of the eyes of the user. The head mounted display device has been technically and ergonomically improved to be conveniently wearable. As a representative form of a head mounted display, a glasses-type head mounted display device has been developed.

SUMMARY

The present disclosure provides a head mounted display device that has a touch input capability. In addition, the present disclosure provides a head mounted display device and a simplified process for fabricating the head mounted display device.

An exemplary embodiment of the present disclosure provides a head mounted display device, including: a display part disposed to correspond to two eyes of a user, and including wires and one or more pixels connected to the wires; and a sensor disposed around the display part and configured to sense a touch of the user. The sensor includes sensing electrodes, and at least one of the sensing electrodes is provided on the same layer as a portion of the display part.

The wires may include: a gate line provided on a base substrate; and a data line provided with an interlayer insulating layer that is interposed between the gate line and the data line. Each pixel may include: a thin film transistor connected to the gate line and the data line; a first electrode provided on the interlayer insulating layer with a passivation layer interposed between the first electrode and the interlayer insulating layer, and connected to the thin film transistor; a second electrode facing the first electrode; and a display element provided between the first electrode and the second electrode.

The sensing electrodes may be provided on the same layer as at least one of the gate line, the data line, and the first electrode.

The sensor may further include connection lines connected to the sensing electrodes, and the connection lines may be provided on the same layer as at least one of the gate line, the data line, and the first electrode.

The sensing electrodes may include first sensing electrodes, to which a first voltage is applied, and second sensing electrodes, to which a second voltage having a level changed according to the touch of the user is applied. The first sensing electrodes may be provided on the same layer as one of the gate line, the data line, and the first electrode, and the second sensing electrodes may be provided on the same layer as another one of the gate line, the data line, and the first electrode.

The thin film transistor may include: an active pattern provided on the base substrate; a gate electrode connected to the gate line, and provided on the active pattern with a gate insulating layer interposed between the active pattern and the gate insulating layer; a source electrode provided on the interlayer insulating layer and connected to the data line; and a drain electrode provided on the interlayer insulating layer, and spaced apart from the source electrode.

The sensing electrodes may be provided on the same layer as the active pattern, and the connection lines may be provided on the same layer as at least one of the gate line and the data line.

At least one of the sensing electrodes may be formed of the same material as at least one of the wires.

The display part may include: a first display corresponding to a right eye of the user; and a second display corresponding to a left eye of the user. The sensor may be provided between the first display and the second display, or the sensor may be provided at a part of circumferences of the first display and the second display.

The display device may have a first surface facing the two eyes of the user and a second surface opposite to the first surface, and the display part may display an image through the first surface, and the sensor senses the touch of the user through the second surface.

The display part may include a material that allows at least a part of light to pass through, or a material that blocks light in a direction from the second surface to the first surface.

Another exemplary embodiment of the present disclosure provides method of fabricating a head mounted display device, including: forming a display part disposed to correspond to two eyes of a user, and including wires and one or more pixels connected to the wires; and forming a sensor disposed around the display part and configured to sense a touch of the user. The sensor includes sensing electrodes, and at least one of the sensing electrodes is formed in the same process as that forming at least one of the wires.

The method may further include: forming a gate line provided on a base substrate; forming a data line provided with an interlayer insulating layer interposed between the gate line and the data line; forming a thin film transistor connected to the gate line and the data line; forming a first electrode provided on the interlayer insulating layer with a passivation layer interposed between the interlayer insulating layer and the passivation layer, and connected to the thin film transistor; forming a second electrode facing the first electrode; and forming a display element provided between the first electrode and the second electrode. The sensing electrodes are formed at the same process as that forming at least one of the gate line, the data line, and the first electrode.

The sensing electrodes may include first sensing electrodes, to which a first voltage is applied, and second sensing electrodes, to which a second voltage having a level changed according to the touch of the user is applied.

The first sensing electrodes may be formed at the same process as that forming one of the gate line, the data line, and the first electrode. The second sensing electrodes may be provided at the same process as that forming another one of the gate line, the data line, and the first electrode.

At least one of the sensing electrodes is formed of the same material on the same layer as at least one of the wires.

BRIEF DESCRIPTION OF THE DRAWINGS

Example embodiments will now be described more fully hereinafter with reference to the accompanying drawings; however, they may be embodied in different forms and should not be construed as being limited to the embodiments set forth herein. Rather, these example embodiments are provided so that the present disclosure will be thorough and complete, and will fully convey the scope of the present disclosure to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals may refer to like elements throughout.

DETAILED DESCRIPTION

Figure 1A:
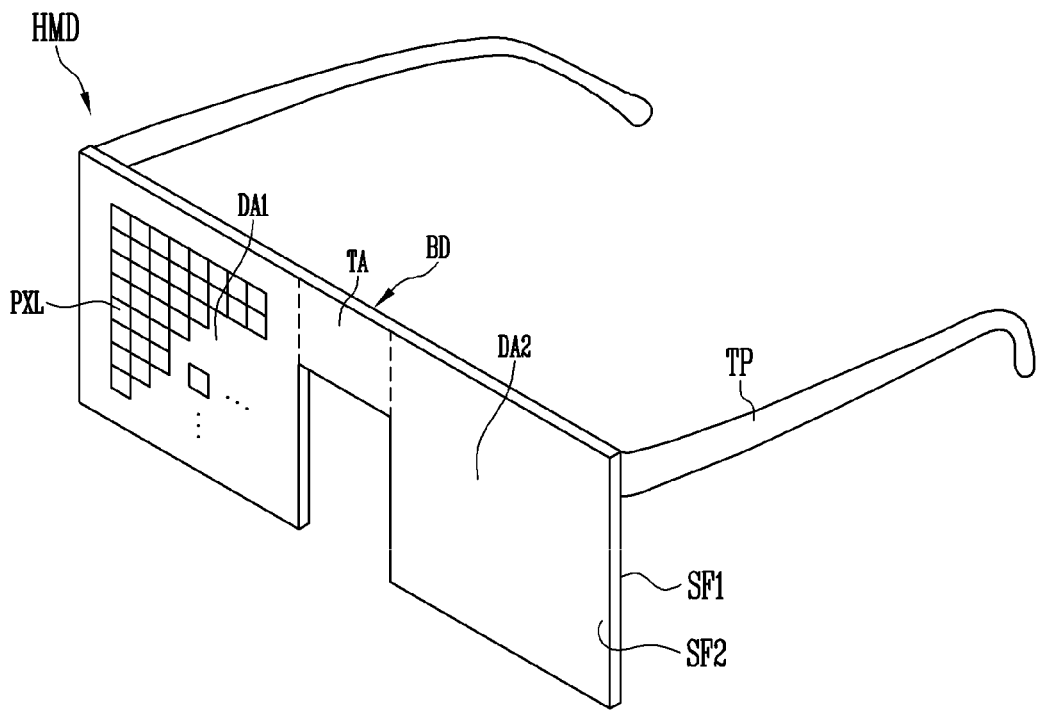
FIGS. 1A and 1B are perspective views illustrating display devices, according to exemplary embodiments of the present disclosure.

The present disclosure may be variously modified and have various forms, so that specific embodiments will be illustrated in the drawings and described in the detailed description. However, it should be understood that the present disclosure is not limited to the specific embodiments, but can include all changes, equivalents, or alternatives that are included in the spirit and technical scope of the present disclosure.

In the description of respective drawings, similar reference numerals designate similar elements. In the accompanying drawings, sizes of structures are illustrated to be changed compared to actual sizes for clarity of the present disclosure. Terms "first", "second", and the like may be used for describing various constituent elements, but the constituent elements should not be limited to the terms. Instead, the terms are used only to discriminate one constituent element from another constituent element. For example, a first element could be termed a second element, and similarly, a second element could be also termed a first element without departing from the scope of the present disclosure. Singular expressions used herein may include plurals expressions unless they have definitely opposite meanings in the context.

In the present application, it will be appreciated that terms "including" and "having" are intended to designate the existence of characteristics, numbers, steps, operations, constituent elements, and components described in the specification or a combination thereof, and do not exclude a possibility of the existence or addition of one or more other specific characteristics, numbers, steps, operations, constituent elements, and components, or a combination thereof. It will be understood that when an element such as a layer, film, region, or substrate is referred to as being "on" another element, it can be directly on the other element or one or more intervening elements may also be present. Further, in the present disclosure, when a part of a layer, a film, an area, a plate, and the like is formed on another part, a direction, in which the part is formed, is not limited only to an upward direction, and includes a lateral direction or a downward direction. On the contrary, it will be understood that when an element such as a layer, film, region, or substrate is referred to as being "beneath" another element, it can be directly beneath the other element or one or more intervening elements may also be present.

An exemplary embodiment of the present disclosure relates to a display device, and more particularly to a head mounted display device that is wearable on a user's head like glasses to enable the user to receive multimedia contents. The display device displays an image and provides the user with image information, senses a touch and/or a pressure of a touch by a hand of the user, a stylus, and/or any other input means, and displays or transmits information in response to the sensed touch.

Figure 1B:
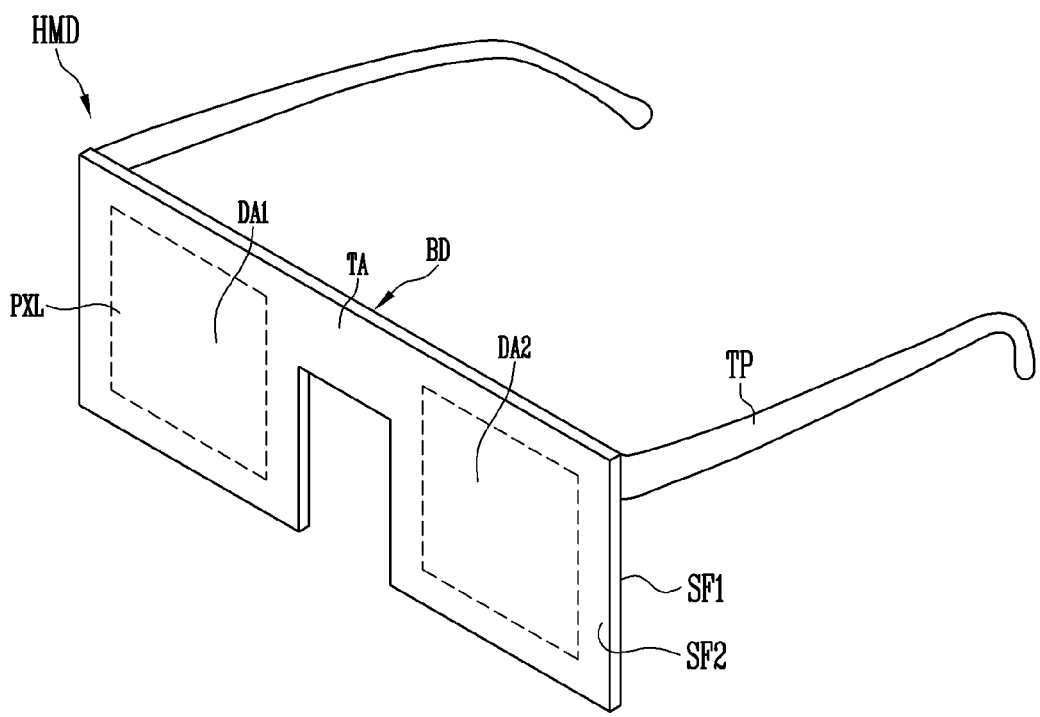

Hereinafter, an exemplary embodiment of the present disclosure will be described in detail with reference to the accompanying drawings. FIGS. 1A and 1B are perspective views illustrating display devices according to exemplary embodiments of the present disclosure. A head mounted display device HMD provides a user with an image, and includes a body BD for sensing a touch and/or a pressure of a touch by a user, and temples TP that are connected to the body BD and fixing the body BD to be wearable on a head of the user.

The body BD is provided in a shape of a plate similar to glasses, and includes a first surface SF1 facing two eyes of the user, and a second surface SF2 opposite to the first surface SF1 and faces the outside. The temples TP positions the body BD on a part of the head of the user. For example, the temples TP are fixed to the ears of the user to position the body BD to face the two eyes of the user.

The temples TP may be provided in various forms to be removably attached to a head of the user. For example, the temples TP may be connected to both sides of the body BD, and extend in parallel to a direction from the first surface SF1 to the two eyes of the user. The shape of the temples TP is not limited thereto.

The body DB includes display parts DA1 and DA2 corresponding to the two eyes of the user, and a sensor TA disposed between the display parts DA1 and DA2 and sensing a touch by the user. The display parts DA1 and DA2 provide the user with an image through the first surface SF1. The display parts DA1 and DA2 may be formed of a transparent or semi-transparent material to pass a part of light through the display parts DA1 and DA2 allowing the user to view the outside through the display parts DA1 and DA2. In one embodiment, the image viewed by the user may include an outside image that is viewed through the display parts DA1 and DA2. The display parts DA1 and DA2 may provide augmented reality (AR) to the user by providing a combined image including an image provided by the display parts DA1 and DA2 and the outside image.

In another embodiment, the display parts DA1 and DA2 may be formed of an opaque light blocking material to block light from passing through the display parts DA1 and DA2 in a direction from the second surface SF2 to the first surface SF1. In this case, the image viewed by the user may be only the images provided through the display parts DA1 and DA2, and the display parts DA1 and DA2 may provide virtual reality (VR) to the user.

Optionally, the display parts DA1 and DA2 may also provide an image to the outside through the second surface SF2. In this case, other people except for the user may view the images on the display parts DA1 and DA2.

The first display part DA1 corresponds to the right eye of the user, and a second display part DA2 corresponds to the left eye of the user. The first display part DA1 and the second display part DA2 may be spaced apart from each other to correspond to the two eyes of the user, but are not limited thereto, and may be provided in an integral form, in which at least parts of the first display part DA1 and the second display part DA2 are connected between the right eye and the left eye of the user.

Each of the first and second display parts DA1 and DA2 includes at least one pixel PXL for providing an image to the two eyes of the user. In the exemplary embodiment of the present disclosure, a plurality of pixels PXL may be provided in a matrix shape having one or more rows and one or more columns. The display parts DA1 and DA2 including the plurality of pixels PXL may be of various types of display devices including, but not limited to, an organic light emitting device, a liquid crystal display device, an electro-wetting device, and an electrophoresis device. For the convenience of description, an organic light emitting device will be described as an example of the display parts DA1 and DA2.

The sensor TA senses a touch and/or a pressure of a touch by the user through the second surface SF2. The sensor TA may include sensing electrodes. In this case, at least some of the sensing electrodes are simultaneously formed when the display parts DA1 and DA2 are formed. The sensing electrodes may be formed of the same material on the same layer of the display parts DA1 and DA2.

The sensing electrodes of the sensor TA senses a touch and/or a pressure. For example, the sensor TA may be implemented in a capacitive type sensor, a piezo-resistive type sensor, etc. The capacitive type sensor may be of a mutual capacitive type that senses a change in capacitance by a mutual operation between two sensing electrodes. The capacitive type sensor may be of a self-capacitive type sensor that senses a change in capacitance of a sensing electrode itself.

In the exemplary embodiment of the present disclosure, the sensor TA may be provided at least one side of the display parts DA1 and DA2. In the exemplary embodiment of the present disclosure, as illustrated in FIG. 1A, the sensor TA may be provided between the first display part DA1 and the second display part DA2.

However, the sensor TA is not limited to the example shown in FIG. 1A. For example, the sensor TA may also be provided in a form surrounding the display parts DA1 and DA2 as illustrated in FIG. 1B. The sensor TA is provided at both a circumference of the first display DA1 and a circumference of the second display DA2, as well as the region between the first display part DA1 and the second display part DA2. The sensor TA may be provided at various positions within a range not to disturb the user to receive and view the image provided by the display parts DA1 and DA2.

Figure 2A:
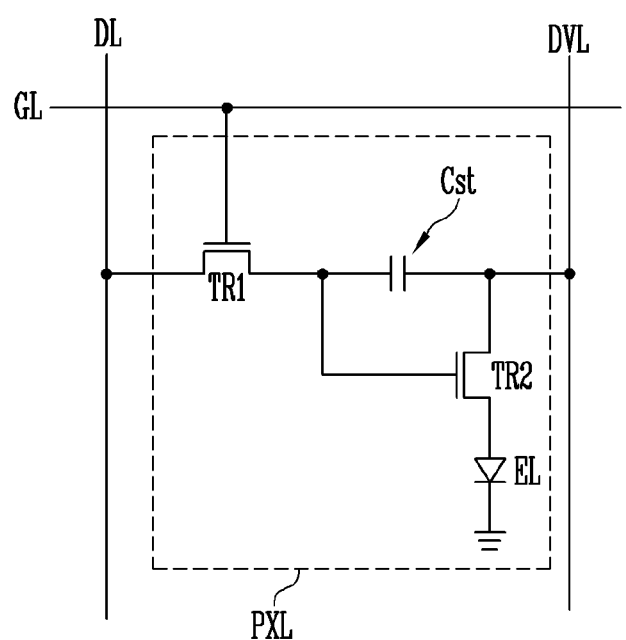
FIG. 2A is a circuit diagram of one pixel in a display part illustrated in FIG. 1.
Figure 2B:
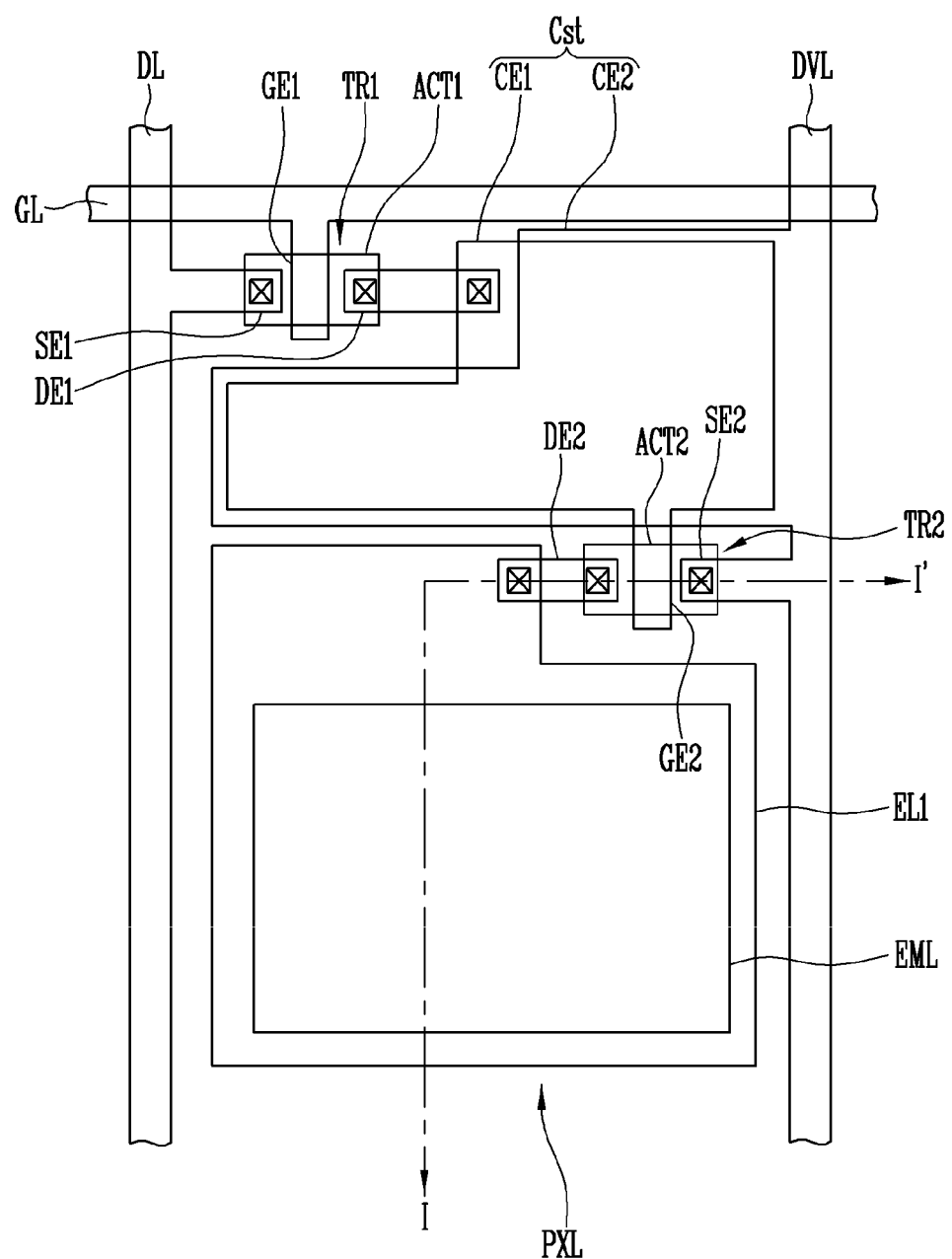
FIG. 2B is a plan view of one pixel illustrated in FIG. 2A.
Figure 3:
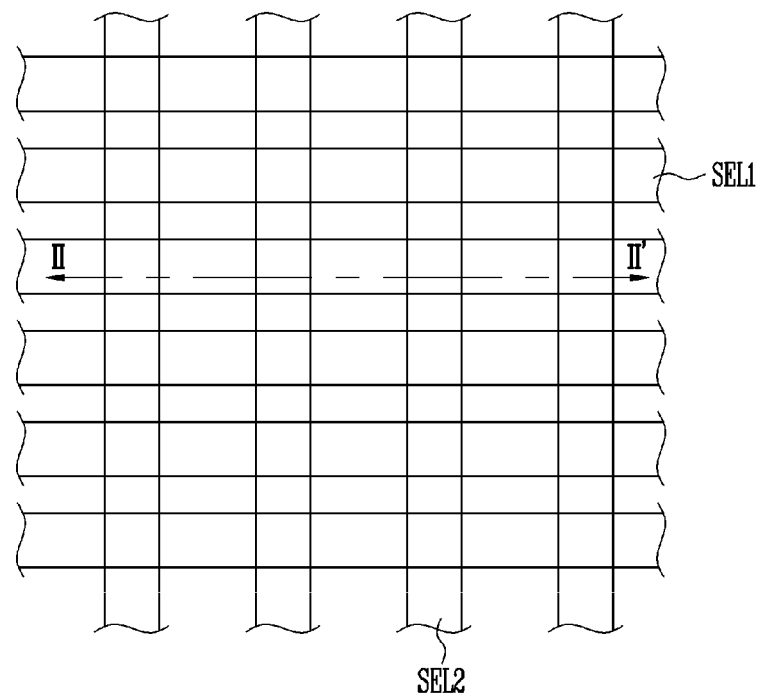
FIG. 3 is a plan view illustrating a part of a touch unit of the sensor TA illustrated in FIG. 1.
Figure 4:
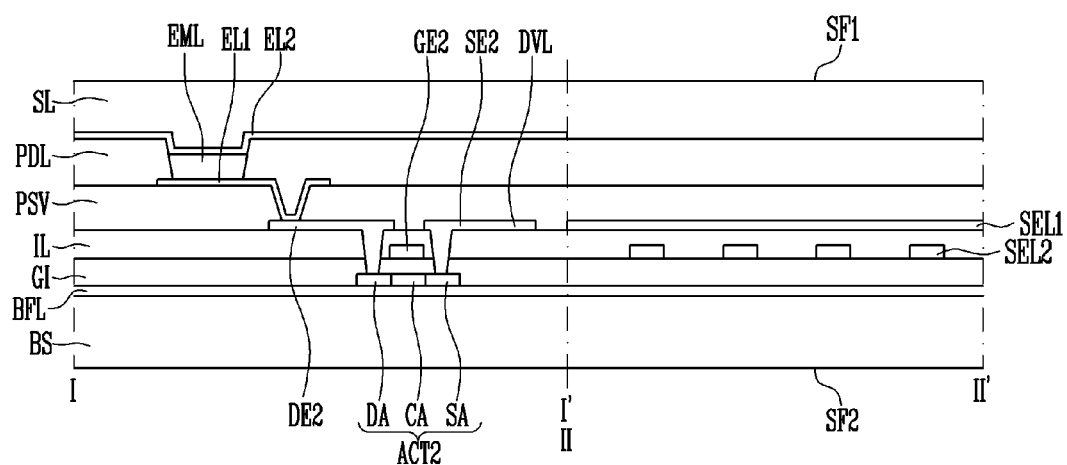
FIG. 4 illustrates a cross-sectional view taken along line I-I' of FIG. 2B, and a cross-sectional view taken along line II-II' of FIG. 3 together.

Hereinafter, the display part and the sensor will be described in detail with reference to FIGS. 2A, 2B, 3, and 4. FIG. 2A is a circuit diagram of one pixel PXL in the display part illustrated in FIG. 1, and FIG. 2B is a plan view of one pixel PXL illustrated in FIG. 2A. FIG. 3 is a plan view illustrating a part of a touch unit of the sensor TA illustrated in FIG. 1. FIG. 4 illustrates a cross-sectional view taken along line I-I' of FIG. 2B, and a cross-sectional view taken along line II-II' of FIG. 3 together.

First, the display part will be first described with reference to FIGS. 2A, 2B, and 4, and then the sensor will be first described with reference to FIGS. 3 and 4.

Referring to FIGS. 2A, 2B, and 4, the display part includes a base substrate BS, a wiring unit, and pixels PXL. The pixels PXL are provided on the base substrate BS. The wiring unit provides a signal to each pixel PXL, and includes a gate line GL, a data line DL, and a driving voltage line DVL.

The gate line GL extends in one direction. The data line DL extends in another direction crossing the gate line GL. The driving voltage line DVL may extend in the substantially same direction as that of the gate line GL or the data line DL, for example, the data line DL. The gate line GL transmits a scan signal to a thin film transistor, the data line DL transmits a data signal to the thin film transistor, and the driving voltage line DVL provides a driving voltage to the thin film transistor. The gate line GL, the data line DL, and the driving voltage lines DVL are provided in plural.

Each pixel PXL displays an image, and as described above, the plurality of pixels PX may be provided and arranged in a matrix form. However, FIGS. 2A and 2B illustrate only one pixel PXL for the convenience of description. Here, each pixel PXL is illustrated as a rectangle, but is not limited thereto, and can be modified in various shapes. Further, the pixels PXL may be provided to have different areas. For example, the pixels PXL having different colors may be provided in different areas or different shapes for each color.

The pixel PXL includes the thin film transistor connected to the wiring unit, an emission element EL connected to the thin film transistor, and a capacitor Cst. The thin film transistor may include a driving thin film transistor TR2 for controlling the emission element EL and a switching thin film transistor TR1 for switching the driving thin film transistor TR2. In the present example, one pixel PXL includes two thin film transistors TR1 and TR2 and one capacitor Cst, but it is not limited thereto. In another example, one pixel PX may include one thin film transistor, or one pixel PXL may include three or more thin film transistors, for example, six thin film transistors. The number of capacitors may also be changed.

The switching thin film transistor TR1 includes a first gate electrode GE1, a first source electrode SE1, and a first drain electrode DE1. The first gate electrode GE1 is connected to the gate line GL, and the first source electrode SE1 is connected to the data line DL. The first drain electrode DE1 is connected to a second gate electrode GE2 of the driving thin film transistor TR2. The switching thin film transistor TR1 transits a data signal applied to the data line DL to the driving thin film transistor TR2 according to a scan signal applied to the gate line GL.

The driving thin film transistor TR2 includes the second gate electrode GE2, a second source electrode SE2, and a second drain electrode DE2. The second gate electrode GE2 is connected to the first drain electrode DE1 of the switching thin film transistor TR1, the second source electrode SE2 is connected to the driving voltage line DVL, and the second drain electrode DE2 is connected to the emission element EL.

The emission element EL includes an emission layer EML, and a first electrode EL1 and a second electrode EL2 that face each other with the emission layer EML interposed therebetween. The first electrode EL1 is connected to the second drain electrode DE2 of the driving thin film transistor TR2. A common voltage may be applied to the second electrode EL2, and the emission layer EML emits light according to an output signal of the driving thin film transistor TR2 and displays an image by emitting or not-emitting light. Light emitted from the emission layer EML may be changed according to a material of the emission layer, and may be color light or white light. The capacitor Cst is connected between the second gate electrode GE2 and the second source electrode SE2 of the driving thin film transistor TR2, and charges and maintains a data signal input into the second gate electrode GE2 of the driving thin film transistor TR2.

Hereinafter, a lamination sequence of the display part, according to the exemplary embodiment of the present disclosure, will be described. The display part includes the thin film transistor and the base substrate BS on which the emission element EL is laminated. The base substrate BS may be formed of an insulating material, such as glass, plastic, and crystal.

A buffer layer BFL is formed on the base substrate BS. The buffer layer BFL prevents impurities from being diffused to the switching and driving thin film transistors TR1 and TR2. The buffer layer BFL may be formed of a silicon nitride (SiNx), a silicon oxide (SiOx), a silicon oxynitride (SiOxNy), or the like. In some embodiments, the buffer layer BFL may be omitted according to a material and a processing condition of the base substrate BS.

A first active pattern ACT1 and a second active pattern ACT2 are provided on the buffer layer BFL. The first active pattern ACT1 and the second active pattern ACT2 are formed of a semiconductor material. Each of the first active pattern ACT1 and the second active pattern ACT2 includes a source area SA, a drain area DA, and a channel area CA that is provided between the source area SA and the drain area DA. The first active pattern ACT1 and the second active pattern ACT2 may be doped or undoped silicon, for example, polysilicon and amorphous silicon, and may have semiconductor patterns formed of a semiconductor oxide or the like. In the exemplary embodiment of the present disclosure, the channel area CA has a semiconductor pattern that is not doped with impurities, and may be an intrinsic semiconductor. The source area SA and the drain area DA may have semiconductor patterns doped with impurities. The impurities, such as n-type impurities, p-type impurities, and other metal, may be doped.

A gate insulating layer GI is provided on the first active pattern ACT1 and the second active pattern ACT2. The first gate electrode GE1 and the second gate electrode GE2 that are connected to the gate line GL are provided on the gate insulating layer GI. The first gate electrode GE1 and the second gate electrode GE2 are formed to cover areas corresponding to the channel areas CA of the first active pattern ACT1 and the second active pattern ACT2, respectively.

An interlayer insulating layer IL is provided on the first and second gate electrodes GE1 and GE2 to cover the first and second gate electrodes GE1 and GE2. The first source electrode SE1, the first drain electrode DE1, the second source electrode SE2, and the second drain electrode DE2 are provided on the interlayer insulating layer IL. The first source electrode SE1 and the first drain electrode DE1 are in contact with the source area SA and the drain area DA of the first active pattern ACT1 by contact holes formed in the gate insulating layer GI and the interlayer insulating layer IL, respectively. The second source electrode SE2 and the second drain electrode DE2 are in contact with the source area SA and the drain area DA of the second active pattern ACT2 by contact holes formed in the gate insulating layer GI and the interlayer insulating layer IL, respectively. A part of the second gate electrode GE2 and a part of the driving voltage line DVL are a first capacitor electrode CE1 and a second capacitor electrode CE2, respectively, and form the capacitor Cst with the interlayer insulating layer IL interposed therebetween.

A passivation layer PSV is provided on the first source electrode SE1, the first drain electrode DE1, the second source electrode SE2, and the second drain electrode DE2. The passivation layer PSV may serve as a passivation layer that protects the switching and driving thin film transistors TR1 and TR2, and may also serve as a planarizing layer that planarizes upper surfaces of the switching and driving thin film transistors TR1 and TR2.

The first electrode EL1 is provided on the passivation layer PSV as an anode of the emission element EL. The first electrode EL1 is connected to the second drain electrode DE2 of the driving thin film transistor TR2 through a contact hole formed in the passivation layer PSV. The first electrode EL1 may be used as a cathode, but in the exemplary embodiment below, the case where the first electrode EL1 is the anode will be described as an example.

The first electrode EL1 may be formed of various materials. In the drawing, when an image is provided in a downward direction of the base substrate BS, the first electrode EL1 may be formed of a transparent conductive layer, such as an indium tin oxide (ITO), an indium zinc oxide (IZO), a zinc oxide (ZnO), and an indium tin zinc oxide (ITZO). In the drawing, when an image is provided in an upward direction of the base substrate BS, the first electrode EL1 may be formed of a metal reflective layer, such as Ag, Mg, Al, Pt, Pd, Au, Ni, Nd, Ir, and Cr, and a transparent conductive layer, such as an indium tin oxide (ITO), an indium zinc oxide (IZO), a zinc oxide (ZnO), and an indium tin zinc oxide (ITZO).

A pixel defining layer PDL dividing the pixel area PA to correspond to each pixel PXL is provided on the base substrate BS on which the first electrode EL1 and the like are formed. The pixel defining layer PDL protrudes from the base substrate BS along a circumference of the pixel PXL while exposing an upper surface of the first electrode EL1.

The emission layer EML is provided in the pixel area PA surrounded by the pixel defining layer PDL, and the second electrode EL2 is provided on the emission layer EML. A sealing layer SL covering the second electrode EL2 is provided on the second electrode EL2.

Referring to FIGS. 3 and 4, the sensor according to the exemplary embodiment of the present disclosure may be implemented by a mutual capacitance scheme. The sensor includes a plurality of first sensing electrodes SEL1, to which a first voltage is applied, and a plurality of second sensing electrodes SEL2, to which a second voltage is applied. The first sensing electrodes SEL1 are arranged in a first direction and the second sensing electrodes are arranged in a second direction crossing the first direction.

In the exemplary embodiment of the present disclosure, the first sensing electrode SEL1 and the second sensing electrode SEL2 that are adjacent or overlap each other are capacitance-coupled. One of the first sensing electrode SEL1 and the second sensing electrode SEL2 may be a driving electrode, to which a driving voltage is applied, and another one may be a sensing electrode, to which a sensing voltage is applied. When a touch is made by the user, the capacitance is changed, and the display device obtains a change in the sensing voltage according to the capacitance, thereby recognizing a touch at a specific position. In the exemplary embodiment of the present disclosure, the first sensing electrode SEL1 may be a driving electrode, and the second sensing electrode SEL2 may be a sensing electrode.

In the exemplary embodiment of the present disclosure, it is illustrated that the first sensing electrodes SEL1 and the second sensing electrodes SEL2 have a rod shape having a width when being viewed on a plane. However, the shape of the first sensing electrodes SEL1 and the second sensing electrodes SEL2 are not limited thereto, and may have various shapes. For example, each of the first sensing electrodes SEL1 and the second sensing electrodes SEL2 may be provided in a polygonal shape.

Hereinafter, the sensor according to the exemplary embodiment of the present disclosure will be described according to a lamination sequence. Referring to FIGS. 2A, 2B, and 4, the sensor according to the exemplary embodiment of the present disclosure includes the first sensing electrodes SEL1 and the second sensing electrodes SEL2 formed on the base substrate BS. The buffer layer BFL and the gate insulating layer GI are provided on the base substrate BS. The second sensing electrode SEL2 is provided on the gate insulating layer GI. The second sensing electrodes SEL2 may be formed to be extended in a first direction. The second sensing electrodes SEL2 may be extended, for example, in the same direction as that of the gate line GL, or in the same direction as that of the data line DL. The second sensing electrodes SEL2 may include the same material as that of the gate line GL. The interlayer insulating layer IL covering the second sensing electrodes SEL2 is provided on the gate insulating layer GI on which the second sensing electrode SEL2 is formed.

The first sensing electrodes SEL1 are provided on the gate insulating layer GI. The first sensing electrodes SEL1 may be extended in a second direction crossing the extension direction of the second sensing electrodes SEL2. The first sensing electrodes SEL1 may include the same material as that of the data line DL, the source electrodes SE1 and SE2, the drain electrode DE, and the driving voltage line DVL.

The passivation layer PSV and the pixel defining layer PDL are provided on the interlayer insulating layer IL on which the second sensing electrodes SEL2 are formed. The passivation layer PSV and the pixel defining layer PDL do not have an opening in a region corresponding to the sensor. The sealing layer SL covering the pixel defining layer PDL is provided on the pixel defining layer PDL.

Referring back to FIGS. 2B, 3, and 4, the display device having the aforementioned structure may be fabricated by a method described below. A buffer layer BFL is formed on a base substrate BS, and a semiconductor pattern is formed on the buffer layer BFL. The semiconductor pattern is formed in a region where a first active layer ACT1 and a second active layer ACT2 are provided later.

The semiconductor pattern may be formed by forming poly silicon, amorphous silicon, an oxide semiconductor, or the like on the base substrate, and patterning the poly silicon, the amorphous silicon, the oxide semiconductor, or the like by using photolithography. A gate insulating layer GI is formed on the semiconductor pattern. Gate electrodes GE1 and GE2, a gate line GL, and a second sensing electrode SEL2 are formed on the gate insulating layer GI. The gate electrodes GE1 and GE2 and the gate line GL may be integrally formed without being separated. The gate electrodes GE1 and GE2, the gate line GL, and the second sensing electrode SEL2 may be formed by forming a metal layer on the gate insulating layer GI and patterning the metal layer by photolithography.

Next, first and second active patterns ACT1 and ACT2 are formed by doping the semiconductor pattern with impurities by using the gate electrodes GE1 and GE2 as a mask. Accordingly, in each of the first and second active patterns ACT1 and ACT2, a channel area CA that is hidden by the gate electrodes GE1 and GE2 and is not doped, and a source area SA and a drain area DA that are not hidden by the gate electrodes GE1 and GE2 and are doped are formed.

Next, an interlayer insulating layer IL is formed on the base substrate BS. When the interlayer insulating layer IL is formed, contact holes for exposing parts of the source area SA and the drain area DA are formed by photolithography.

Then, source electrodes SE1 and SE2, drain electrodes DE1 and DE2, a data line DL, a driving voltage line DVL, and a first sensing electrode SEL1 are formed on the interlayer insulating layer IL. The source electrodes SE1 and SE2, the drain electrodes DE1 and DE2, the data line DL, the driving voltage line DVL, and the first sensing electrode SEL1 may be formed by forming a metal layer on the interlayer insulating layer IL and patterning the metal layer by photolithography. The source electrodes SE1 and SE2 and the drain electrodes DE1 and DE2 are connected to the source area SA and the drain area DA through the contact holes, respectively.

Next, a passivation layer PSV is formed on the base substrate BS. A contact hole for exposing parts of the drain electrodes DE1 and DE2 is formed by photolithography when the passivation layer PSV is formed.

Then, a first electrode EL1 is formed on the passivation layer PSV. The first electrode EL1 may be formed by forming a conductive layer and patterning the conductive layer by using photolithography. The first electrode EL1 is connected to the drain electrodes DE1 and DE2 through the contact holes.

A pixel defining layer PDL dividing each pixel is formed on the first electrode EL1 by using photolithography, and an emission layer EML is formed within the pixel PXL divided by the pixel defining layer PDL. A second electrode EL2 is formed on the emission layer EML, and a sealing layer SL covering the second electrode EL2 is formed on the second electrode EL2.

As described above, in the exemplary embodiment of the present disclosure, as least one of the first sensing electrodes SEL1 and the second sensing electrodes SEL2 may be fabricated in the same process as a portion of the display part, that is, at least one of the conductive elements of the wiring unit and/or the pixels. As a result, the first and second sensing electrodes SEL1 and SEL2 may be provided with the same material on the same layer as that of the conductive element.

According to the exemplary embodiment of the present disclosure, a head mounted display device that includes the display part and the sensor is provided. The head mounted display device is capable of efficiently sensing a touch of a user and displaying an image through the display part. Further, the display part and the sensor can be fabricated together to simplify a fabricating method, and as a result, reducing costs and time for fabricating the head mounted display device.

In the exemplary embodiment of the present disclosure, within the scope of the present disclosure, the method of forming each element of the display part is not limited thereto, and may be changed in various manners. For example, the data line DL and the driving voltage line DVL may be formed of different materials on different layers, and the number of times of the photolithography process using the mask may be changed.

Figure 5:
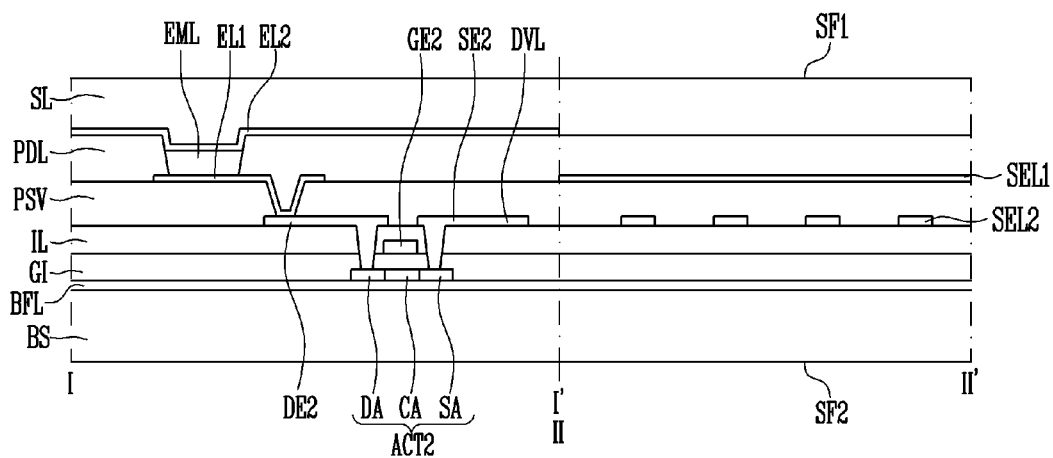
FIG. 5 is a diagram illustrating a display device according to an exemplary embodiment of the present disclosure, and illustrates a cross-sectional view taken along line I-I' of FIG. 2B, and a cross-sectional view taken along line II-II' of FIG. 3 together.

Further, in the exemplary embodiment of the present disclosure, the second sensing electrodes SEL2 are provided with the same material on the same layer as those of the gate line GL, and the first sensing electrodes SEL1 are provided with the same material on the same layer as those of the data line DL. However, the first and second sensing electrodes SEL1 and SEL2 are not limited thereto, and may be provided on layers on which other conductive elements are formed. FIG. 5 is a diagram illustrating a display device according to an exemplary embodiment of the present disclosure. The first and second electrodes SEL1 and SEL2 are formed on layers different from those of the aforementioned exemplary embodiment. FIG. 5 illustrates a cross-sectional view taken along line I-I' of FIG. 2B and a cross-sectional view taken along line II-II' of FIG. 3 together.

In the exemplary embodiments below, in order to avoid duplicate description, those parts that are different from the aforementioned exemplary embodiment will be mainly described. Further, in the exemplary embodiments below, the substantially same element will be described by using the same reference numeral, and non-described parts may follow the description of the aforementioned exemplary embodiment.

Referring to FIGS. 2B and 5, a first sensing electrode SEL1 is provided on a passivation layer PSV, and a second sensing electrode SEL2 is provided on an interlayer insulating layer IL. In the present exemplary embodiment, the first sensing electrode SEL1 may be formed in the same process as that of the first electrode EL1 of a display part, and the second sensing electrode SEL2 may be formed together in the same process as that of a data line DL, source electrodes SEL1 and SEL2, drain electrodes DE1 and DE2, and a driving voltage line DVL. Accordingly, the first sensing electrode SEL1 is formed of the same material as that of the first electrode EL1, and the second sensing electrode SEL2 is formed of the same material as that of the data line DL, source electrodes SEL1 and SEL2, drain electrodes DE1 and DE2, and a driving voltage line DVL.

Figure 6:
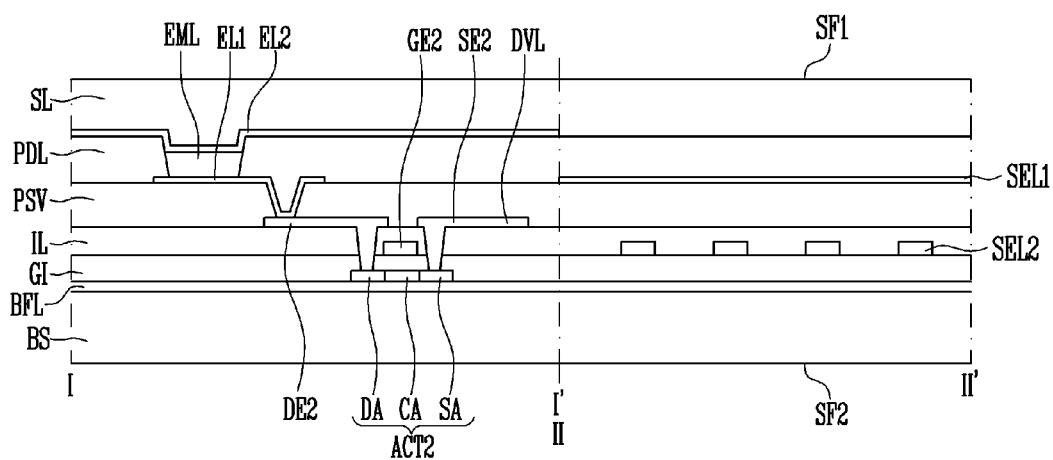
FIG. 6 is a diagram illustrating a display device, according to an exemplary embodiment of the present disclosure, and illustrates a cross-sectional view taken along line I-I' of FIG. 2B, and a cross-sectional view taken along line II-II' of FIG. 3 together.

FIG. 6 is a diagram illustrating a display device according to an exemplary embodiment of the present disclosure, and illustrates a cross-sectional view taken along line I-I' of FIG. 2B, and a cross-sectional view taken along line II-II' of FIG. 3 together.

Referring to FIGS. 2B and 6, a first sensing electrode SEL1 is provided on a passivation layer, and a second sensing electrode SEL2 is provided on a gate insulating layer GI. In the present exemplary embodiment, the first sensing electrode SEL1 may be formed in the same process as that of a first electrode EL of a display part, and the second sensing electrode SEL2 may be formed together in the same process as that of a gate line GL and gate electrodes GE1 and GE2. Accordingly, the first sensing electrode SEL1 is formed of the same material as that of the first electrode EL1, and the second sensing electrode SEL2 is formed of the same material as that of the gate line GL and the gate electrodes GE1 and GE2.

Figure 7:
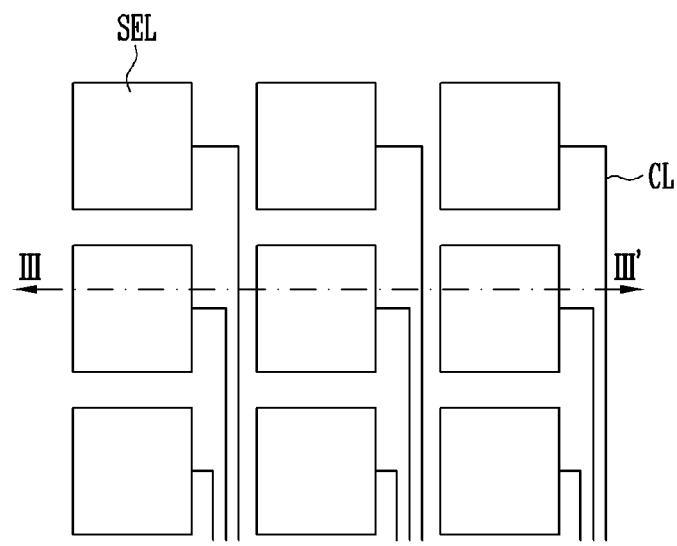
FIG. 7 is a plan view illustrating a part of a sensor in a case where the sensor is implemented in a self-capacitance scheme.
Figure 8:
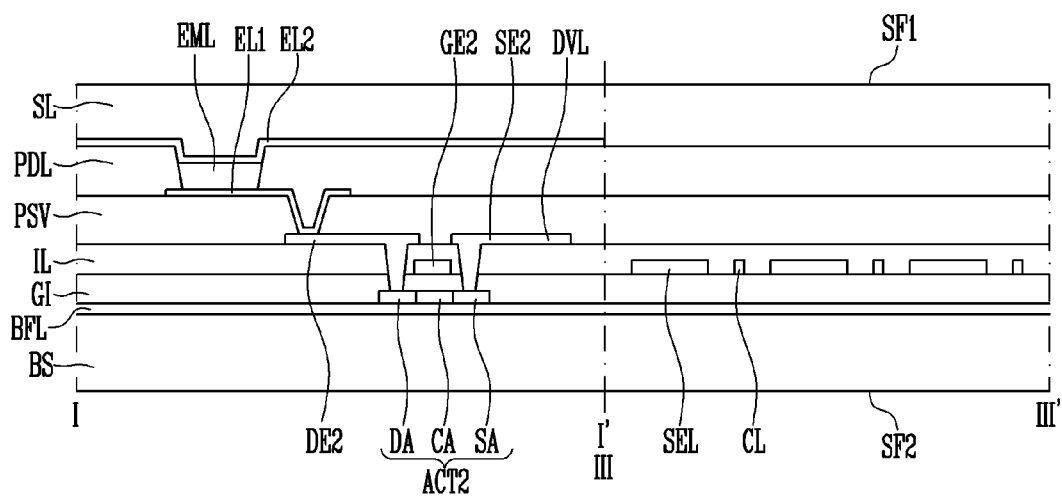
FIGS. 8 to 10 are cross-sectional views taken along line III-III' of FIG. 7 according to respective exemplary embodiments, and illustrate cross-sections of the display part corresponding to line I-I' of FIG. 2B together.
Figure 9:
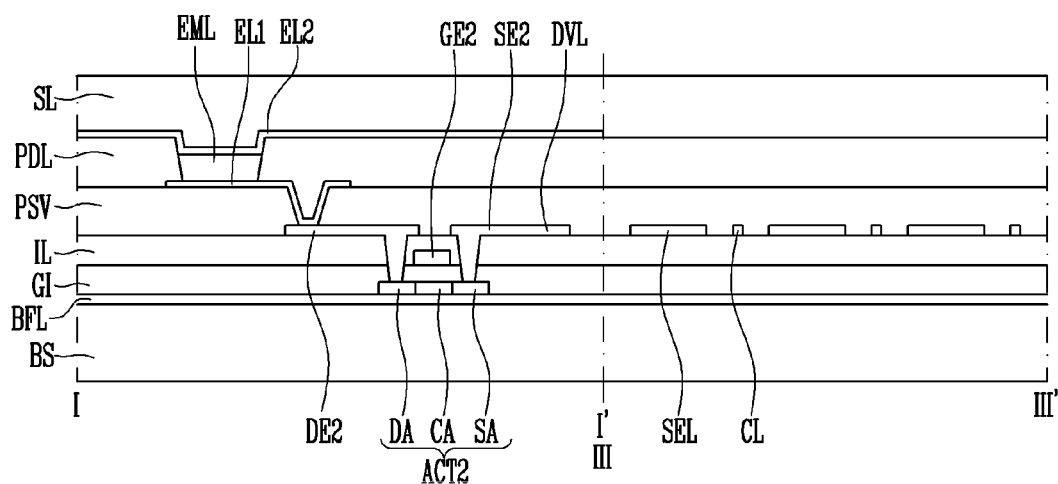
Figure 10:
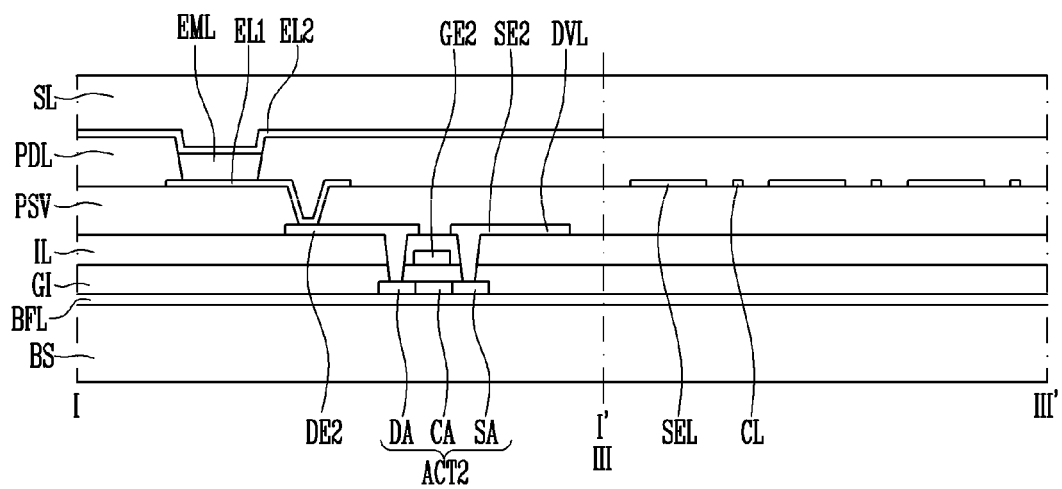

The sensor according to the exemplary embodiment of the present disclosure may be implemented by a mutual-capacitance scheme or a self-capacitance scheme. FIG. 7 is a plan view illustrating a part of a sensor in a case where the sensor is implemented in a self-capacitance scheme. FIGS. 8 to 10 are cross-sectional views taken along line III-III' of FIG. 7 according to respective exemplary embodiments. FIGS. 8 to 10 illustrate cross-sections of the display part corresponding to line I-I' of FIG. 2B together.

Referring to FIG. 7, a sensor includes sensing electrodes SEL that are arranged in a matrix form. Each sensing electrode SEL is connected to a connection line CL, a certain voltage is applied to each sensing electrode SEL through the connection line CL. When a user touches the sensor, capacitance of the sensing electrode SEL of the touched area is changed, and thus, the sensor may obtain a certain voltage change according to the change in the capacitance, thereby recognizing the touch at a specific position.

Each sensing electrode SEL and each connection line CL of the sensor according to the exemplary embodiment of the present disclosure may be formed on a single layer, and may be formed in the same process as that of one among the conductive elements of the display part. Accordingly, the sensing electrode SEL and the connection line CL may be formed of the same material as that of one among the conductive elements of the display part.

First, referring to FIGS. 2B and 8, the sensing electrodes SEL and the connection lines CL are provided on a gate insulating layer GI. In the present exemplary embodiment, the sensing electrodes SEL and the connection lines CL may be formed together in the same process as that of the gate line GL and the gate electrodes GE1 and GE2. Accordingly, the sensing electrodes SEL and the connection lines CL are formed of the same material as that of the gate line GL and the gate electrodes GE1 and GE2.

Referring to FIG. 9, the sensing electrodes SEL and the connection lines CL are provided on an interlayer insulating layer IL. In the present exemplary embodiment, the sensing electrodes SEL and the connection lines CL may be formed in the same process as that of the data line DL, the source electrodes SE1 and SE2, the drain electrodes DE1 and DE2, and the driving voltage line DVL. Accordingly, the sensing electrodes SEL and the connection lines CL are formed of the same material as that of the data line GL, the source electrodes SE1 and SE2, the drain electrodes DE1 and DE2, and the driving voltage line DVL.

Referring to FIG. 10, the sensing electrodes SEL and the connection lines CL are provided on a passivation layer PSV. In the present exemplary embodiment, the sensing electrodes SEL and the connection lines CL may be formed in the same process as that of the first electrode EL1. Accordingly, the sensing electrodes SEL and the connection lines CL are formed of the same material as that of the first electrode EL1.

Figure 11A:
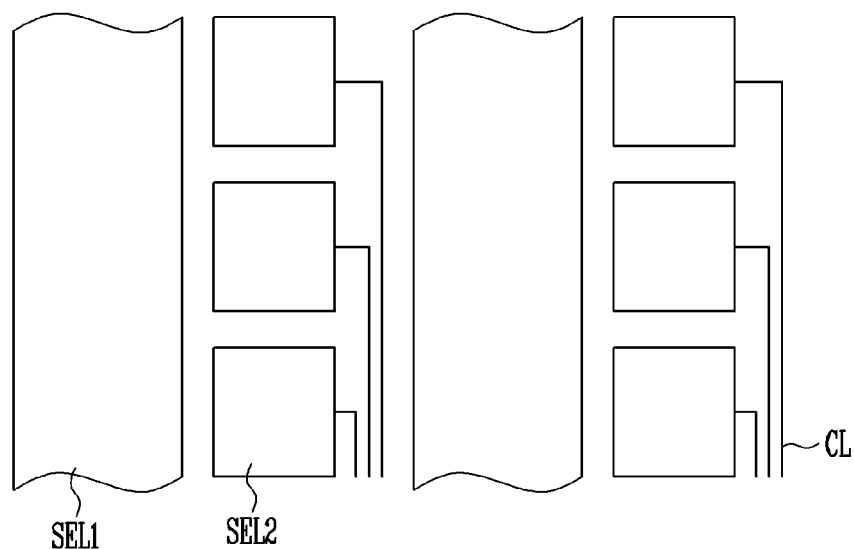
FIGS. 11A and 11B are plan views illustrating sensing electrodes and connection lines of the sensor in the exemplary embodiments of the present disclosure.
Figure 11B:
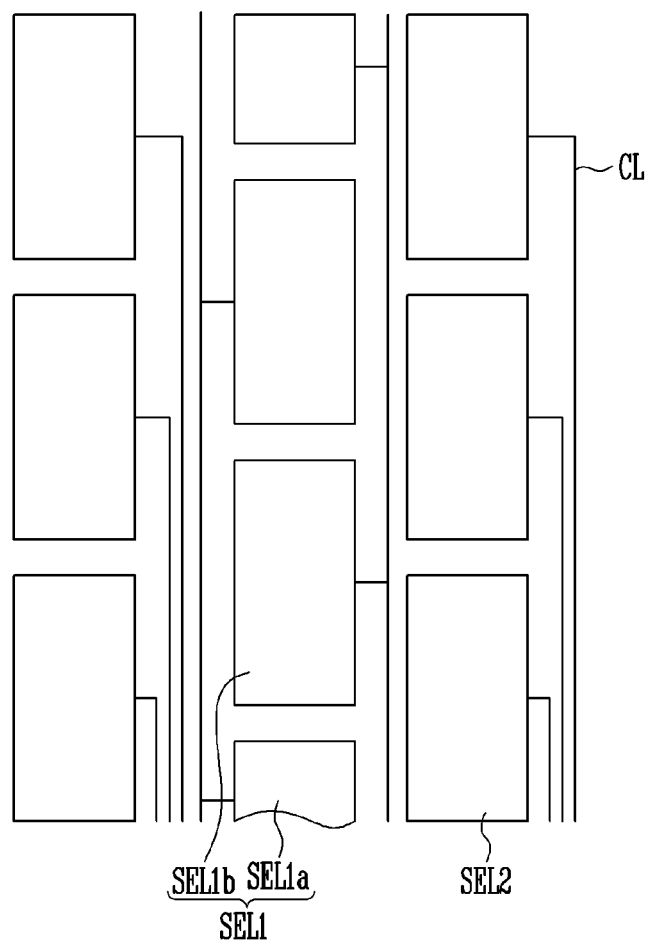

In the exemplary embodiment of the present disclosure, when the sensor is implemented by a touch sensor in a capacitance scheme, the shapes of the sensing electrodes and the connection lines may be variously changed. FIGS. 11A and 11B illustrates the cases where the sensing electrodes and the connection lines of the sensor are differently provided from those of the aforementioned exemplary embodiment. As long as the shapes of the sensing electrodes and a connection relation of the connection lines satisfy the concept that the sensing electrodes are formed of the same material on the same layer in the same process as that of at least one of the elements of the display part as described in the aforementioned exemplary embodiment, the sensor may be variously changed according to the mutual capacitance scheme or the self-capacitance scheme.

Referring to FIG. 11A, a sensor includes first sensing electrodes SEL1 and second sensing electrodes SEL2, and the first sensing electrodes SEL1 may be provided in a rod shape extended in a first direction (e.g., a column direction), and the plurality of second sensing electrodes SEL2 may be provided between the first sensing electrodes SEL1. Although not illustrated in FIG. 11A, the second sensing electrodes SEL2 may be electrically connected and arranged in a second direction (e.g., a row direction) that is different from the first direction.

Referring to FIG. 11B, a sensor includes first sensing electrodes SEL1 and second sensing electrodes SEL2. The first sensing electrodes SEL1 may include first sub sensing electrodes SEL1a and second sub sensing electrodes SEL1b according to a connection relation with a connection line CL.

All of the sensors of FIGS. 11A and 11B may be driven by the mutual capacitance scheme, and one of the first sensing electrodes SEL1 and the second sensing electrodes SEL2 may be used as a driving electrode, and the other may be used as a sensing electrode SEL. All of the first sensing electrodes SEL1, the second sensing electrodes SEL2, and the connection line CL may be provided on a single layer. For example, similar to FIGS. 8 to 10, the first sensing electrodes SEL1, the second sensing electrodes SEL2, and the connection line CL may be formed of the same material as that of a gate line GL and the like on a gate insulating layer, the same material as that of a data line and the like on an interlayer insulating layer, or the same material as that of a first electrode on a passivation layer.

Figure 12:
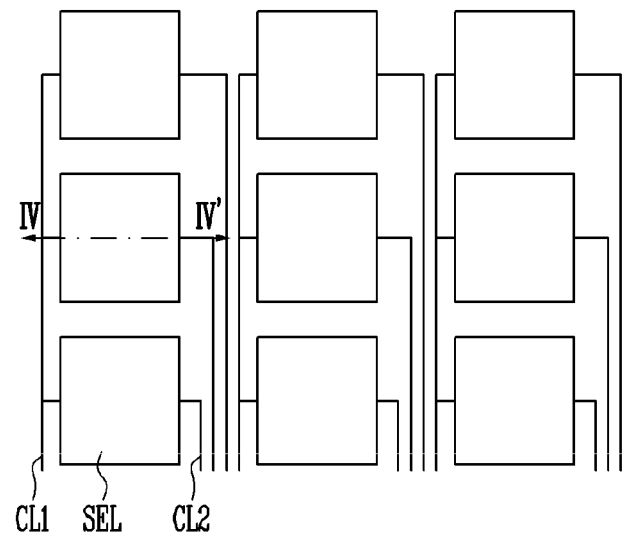
FIG. 12 is a plan view illustrating sensing electrodes and connection lines when the sensor is provided in a piezoresistive scheme, according to an exemplary embodiment of the present disclosure.

According to an exemplary embodiment of the present disclosure, the sensor of the present disclosure may be provided in a piezoresistive scheme. FIG. 12 illustrates sensing electrodes SEL and connection lines when a sensor is provided in a piezoresistive scheme, and FIG. 13 is a cross-sectional view taken along line IV-IV' of FIG. 12.

Figure 13:
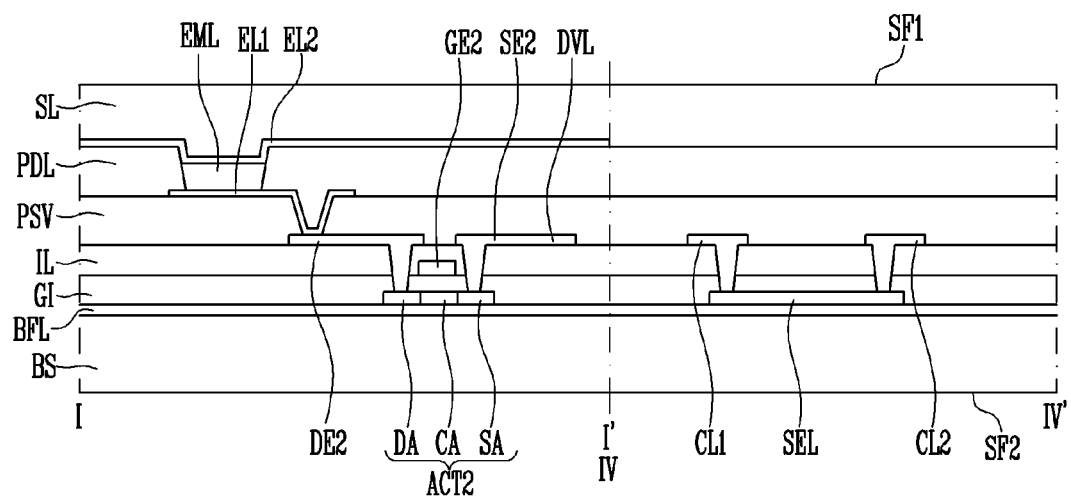
FIG. 13 is a cross-sectional view taken along line IV-IV' of FIG. 12.

Referring to FIGS. 2B, 12, and 13, the sensor includes sensing electrodes SEL formed of a material, of which resistance is changed according to an applied pressure, and the sensing electrodes SEL may be arranged in a matrix form. According to the exemplary embodiment of the present disclosure, a material of active patterns ACT1 and ACT2 provided in a display part may be used as a material of a piezoresistive element. For example, an oxide semiconductor may be used as a material of the piezoresistive element to form the sensing electrodes. Connection lines are connected to each sensing electrode SEL, and the connection line may include a first connection line CL1 connected to one side of each sensing electrode SEL and a second connection line CL2 connected to another side of each sensing electrode SEL. In the exemplary embodiment of the present disclosure, when a user touches the sensor, resistance of the sensing electrode SEL of a touched area is changed, and thus, the sensor may recognize the touch of the user at a specific position through a change in the resistance. Each sensing electrode of the sensor may be scan-driven. That is, a time-divided scan signal may be applied from the first connection line CL1 to the sensing electrodes SEL, and a resistance difference in the scan signal applied to the sensing electrodes SEL through the second connection line CL2 connected to each of the sensing electrodes SEL may be sensed. In this case, a touch of the user may be identified by sensing the resistance difference of the sensing electrode on which the touch of the user is made, through the second connection line CL2 connected to the sensing electrode.

The sensing electrodes SEL are provided on a buffer layer BFL. In the present exemplary embodiment, the sensing electrodes SEL may be formed in the same process as that of the active patterns ACT1 and ACT2. In the present exemplary embodiment, the sensing electrodes SEL may be formed of the same material as that of the active patterns ACT1 and ACT2. The connection lines including the first connection lines CL1 and the second connection lines CL2 may be provided on an interlayer insulating layer IL, and may be connected to the sensing electrodes SEL through contact holes formed in a gate insulating layer GI and the interlayer insulating layer IL, respectively.

The first connection lines CL1 and the second connection lines CL2 may be formed in the same process as that of the data line DL and the like. Accordingly, the first connection lines CL1 and the second connection lines CL2 may be formed of the same material as that of the data line DL and the like.

FIG. 13 illustrates the first connection lines CL1 and the second connection lines CL2 that are formed in the same process as that of the data line EL and the like. However, the first connection lines CL1 and the second connection lines CL2 are not limited thereto, and the first connection lines CL1 and the second connection lines CL2 may be formed in the same process as that of a gate line GL and the like, or in the same process as that of a first electrode EL1.

Figure 14:
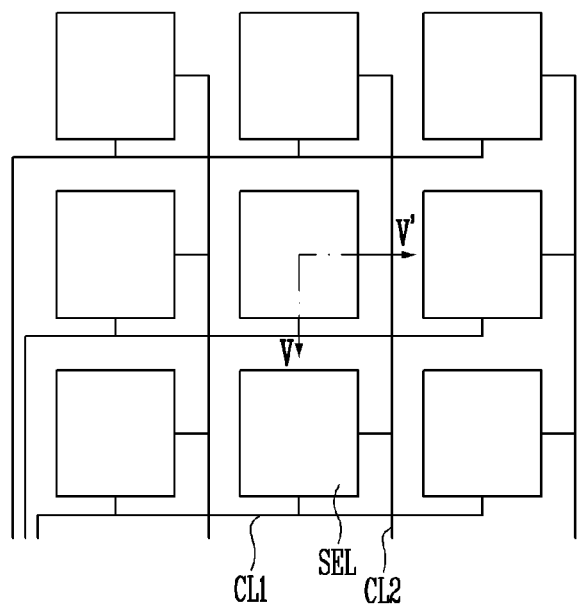
FIG. 14 is a plan view illustrating a case where a piezoresistive touch sensor is scan-driven in an exemplary embodiment of the present disclosure.
Figure 15:
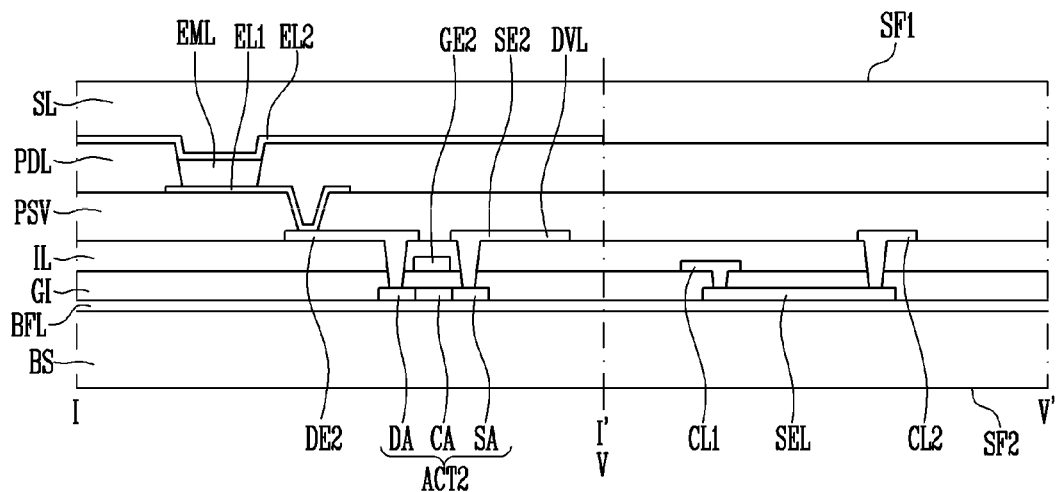
FIG. 15 is a cross-sectional view taken along line V-V' of FIG. 14.

In the exemplary embodiment of the present disclosure, when the sensor is implemented by a touch sensor in a piezoresistive scheme, the shapes of the sensing electrodes and the connection lines may be variously changed. FIG. 14 illustrates a case where the piezoresistive touch sensor is scan-driven in an exemplary embodiment of the present disclosure, and FIG. 15 is a cross-sectional view taken along line V-V' of FIG. 14, and illustrates the sensor including sensing electrodes, first connection lines, and second connection line that are differently provided. As long as the shapes of the sensing electrodes and a connection relation of the connection lines satisfy the concept that the sensing electrodes are formed of the same material on the same layer in the same process as that of at least one of the elements of the display part as described in the aforementioned exemplary embodiment, the sensor may be variously changed.

Referring to FIGS. 2B, 14, and 15, sensing electrodes SEL may be provided on a buffer layer BFL, and be formed in the same process as that of active patterns ACT1 and ACT2. Accordingly, the sensing electrodes SEL may be formed of the same material as that of the active patterns ACT1 and ACT2.

The connection lines including first connection lines CL1 and second connection lines CL2 are provided on different layers. The first connection line CL1 may be provided on the gate insulating layer GI, and connected to each corresponding sensing electrode SEL through the contact hole formed in the gate insulating layer GI. The second connection line CL2 may be provided on the interlayer insulating layer IL, and may be connected to each corresponding sensing electrode SEL through the contact hole formed in the gate insulating layer GI and the interlayer insulating layer IL.

The first connection lines CL1 may be formed in the same process as that of a gate line GL, and thus, the first connection lines CL1 may be formed of the same material as that of the gate line GL and the like. The second connection lines CL2 may be formed in the same process as that of a data line DL and the like. Accordingly, the second connection lines CL2 may be formed of the same material as that of the data line DL and the like.

FIG. 14 illustrates the first connection lines that are formed in the same process as that of the gate line and the like and the second connection lines that are formed in the same process as that of the data line and the like. However, the first and second connection lines are not limited thereto, and may be formed in the same process together with other conductive elements.

Example embodiments have been disclosed herein, and although specific terms are employed, they are used and are to be interpreted in a generic and descriptive sense only and not for purpose of limitation. In some instances, as would be apparent to one of ordinary skill in the art, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure.

What is claimed is:

1. A head mounted display device, comprising:
   a base substrate;
   a display part disposed on the base substrate and configured to display an image to two eyes of a user, and including wires and one or more pixels connected to the wires; and
   a sensor part disposed on the base substrate adjacent to the display part and configured to sense a touch of the user,
   wherein the sensor part includes sensing electrodes, and at least one of the sensing electrodes of the sensor part and a portion of the display part are formed on the base substrate in a same process,
   wherein the sensor part includes a sensing region, and the display part includes a first display region and a second display region that are adjacent to the sensing region and separated by the sensing region,
   wherein the base substrate integrally extends over the first display region, the sensing region, and the second display region,
   wherein the display part displays the image through an inner surface of the head mounted display device that faces the two eyes of the user, and
   wherein the sensor part senses the touch of the user through an outer surface of the head mounted display device that is opposite to the inner surface and faces outwardly away from the two eyes of the user.

2. The head mounted display device of claim 1, wherein the wires include:
   a gate line provided on the base substrate; and
   a data line provided on an interlayer insulating layer that is interposed between the gate line and the data line, and
   wherein each pixel of the one or more pixels includes:
   a thin film transistor connected to the gate line and the data line;
   a first electrode provided on the interlayer insulating layer with a passivation layer interposed between the first electrode and the interlayer insulating layer, and connected to the thin film transistor;
   a second electrode facing the first electrode; and
   a display element provided between the first electrode and the second electrode.

3. The head mounted display device of claim 2, wherein the sensor part further includes connection lines connected to the sensing electrodes.

4. The head mounted display device of claim 3, wherein the connection lines are provided on a same layer as at least one of the gate line, the data line, and the first electrode.

5. The head mounted display device of claim 2, wherein the sensing electrodes include first sensing electrodes, to which a first voltage is applied, and second sensing electrodes, to which a second voltage having a level changed according to the touch of the user is applied.

6. The head mounted display device of claim 5, wherein the first sensing electrodes are provided on the same layer as one of the gate line, the data line, and the first electrode, and
   wherein the second sensing electrodes are provided on a same layer as another one of the gate line, the data line, and the first electrode.

7. The head mounted display device of claim 3, wherein the thin film transistor includes:
   an active pattern provided on the base substrate;
   a gate electrode connected to the gate line, and provided on the active pattern with a gate insulating layer interposed between the active pattern and the gate insulating layer;
   a source electrode provided on the interlayer insulating layer and connected to the data line; and
   a drain electrode provided on the interlayer insulating layer, and spaced apart from the source electrode.

8. The head mounted display device of claim 7, wherein the sensing electrodes are provided on a same layer as the active pattern, and
   wherein the connection lines are provided on a same layer as at least one of the gate line and the data line.

9. The head mounted display device of claim 1, wherein at least one of the sensing electrodes is formed of a same material as at least one of the wires.

10. The head mounted display device of claim 1, wherein the display part include:
    a first display corresponding to a right eye of the user; and
    a second display corresponding to a left eye of the user.

11. The head mounted display device of claim 10, wherein the sensor part is provided between the first display and the second display.

12. The head mounted display device of claim 10, wherein the sensor part is provided at a part of circumferences of the first display and the second display.

13. The head mounted display device of claim 1, wherein the display part includes a material that allows at least a part of light to pass through.

14. The head mounted display device of claim 1, wherein the display part includes a material that blocks light in a direction from the outer surface to the inner surface.

15. A method of fabricating a head mounted display device, comprising:

forming a display part disposed on a base substrate to correspond to two eyes of a user, including wires and one or more pixels connected to the wires and configured to display an image to the two eyes of the user; and forming a sensor part disposed on the base substrate around the display part and configured to sense a touch of the user, wherein the sensor part includes sensing electrodes, and at least one of the sensing electrodes of the sensor part and at least one of the wires of the display part are formed in a same process, wherein the sensor part includes a sensing region, and the display part includes a first display region and a second display region that are adjacent to the sensing region and separated by the sensing region, wherein the base substrate integrally extends over the first display region, the sensing region, and the second display region, wherein the display part displays the image through an inner surface of the head mounted display device that faces the two eyes of the user, and wherein the sensor part senses the touch of the user through an outer surface of the head mounted display device that is opposite to the inner surface and faces outwardly away from the two eyes of the user.

16. The method of claim 15, wherein the forming of the display part includes:

forming a gate line provided on the base substrate;

forming a data line provided with an interlayer insulating layer interposed between the gate line and the data line;

forming a thin film transistor connected to the gate line and the data line;

forming a first electrode provided on the interlayer insulating layer with a passivation layer interposed between the first electrode and the interlayer insulating layer, and connected to the thin film transistor;

forming a second electrode facing the first electrode; and forming a display element provided between the first electrode and the second electrode, wherein the sensing electrodes are formed at a same process as that forming at least one of the gate line, the data line, and the first electrode.

17. The method of claim 16, wherein the sensing electrodes include first sensing electrodes, to which a first voltage is applied, and second sensing electrodes, to which a second voltage having a level changed according to the touch of the user is applied, wherein the first sensing electrodes are formed at the same process as that forming one of the gate line, the data line, and the first electrode, and wherein the second sensing electrodes are provided at a same process as that forming another one of the gate line, the data line, and the first electrode.

18. The method of claim 15, wherein at least one of the sensing electrodes is formed of a same material on a same layer as at least one of the wires.

* * * * *